United States Patent
Tsuzaki

(10) Patent No.: US 9,093,961 B2
(45) Date of Patent: Jul. 28, 2015

(54) OPERATIONAL AMPLIFIER

(71) Applicant: Seiko Instruments Inc., Chiba-shi, Chiba (JP)

(72) Inventor: Toshiyuki Tsuzaki, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 11 days.

(21) Appl. No.: 14/190,862

(22) Filed: Feb. 26, 2014

(65) Prior Publication Data

US 2014/0240042 A1    Aug. 28, 2014

(30) Foreign Application Priority Data

Feb. 28, 2013    (JP) .................... 2013-039652

(51) Int. Cl.
*H03F 3/45*    (2006.01)

(52) U.S. Cl.
CPC .................... *H03F 3/45* (2013.01)

(58) Field of Classification Search
CPC .................................................. H03F 3/45
USPC ............................................ 330/69, 252, 51
See application file for complete search history.

(56) References Cited

U.S. PATENT DOCUMENTS

| 5,648,742 | A  | * | 7/1997 | Ghaffaripour et al. | 330/51 |
| 6,765,437 | B2 | * | 7/2004 | Goutti et al. | 330/51 |
| 7,142,055 | B2 | * | 11/2006 | Inokuchi | 330/253 |
| 2003/0081663 | A1 | | 5/2003 | Nagano | |

FOREIGN PATENT DOCUMENTS

JP    2003-143239 A    5/2003

* cited by examiner

*Primary Examiner* — Henry Choe
(74) *Attorney, Agent, or Firm* — Brinks Gilson & Lione

(57) ABSTRACT

There is provided an operational amplifier capable of detecting that an input terminal has been open circuited without restricting the voltage range of an input signal. The operational amplifier includes a first comparator which detects that an inverting input terminal of an operational amplifier has been open circuited, a second comparator which detects that a non-inverting input terminal of the operational amplifier has been open circuited, a first resistor and a first switch which are controlled by output signals of the first comparator and the second comparator and which are connected in series between the non-inverting input terminal and a ground terminal of the operational amplifier, and a second resistor and a second switch which are connected in series between the inverting input terminal and a supply terminal of the operational amplifier.

2 Claims, 3 Drawing Sheets

OPERATIONAL AMPLIFIER

RELATED APPLICATIONS

This application claims priority under 35 U.S.C. §119 to Japanese Patent Application No. 2013-039652 filed on Feb. 28, 2013, the entire content of which is hereby incorporated by reference.

BACKGROUND OF THE INVENTION

1. Field of the Invention

The present invention relates to an operational amplifier and more particularly to an operational amplifier capable of preventing, without restricting an input signal voltage range, an output terminal from becoming inconstant when an input terminal is open circuited.

2. Background Art

FIG. 3 is a circuit diagram of a conventional operational amplifier. The conventional operational amplifier is comprised of comparators 301 and 303, reference voltage circuits 302 and 304, an OR circuit 305, a constant current circuit 306, an operational amplifier 106, resistors 307 and 308, input terminals 101 and 102, an output terminal 103, a supply terminal 104, and a ground terminal 105.

The operation of the conventional operational amplifier will be described.

The comparator 301 outputs a high signal when the voltage of a non-inverting input terminal exceeds the voltage of the reference voltage circuit 302. The voltage of the reference voltage circuit 302 is set to a voltage that is lower than a voltage VDD of the supply terminal 104. When the input terminal 101 is placed in an open state, the non-inverting input terminal of the comparator 301 is pulled up to the voltage VDD by the resistor 307. This enables the comparator 301 to detect that the input terminal 101 has been open circuited.

The comparator 303 outputs the High signal when the voltage of the inverting input terminal reduces to be lower than the voltage of the reference voltage circuit 304. The voltage of the reference voltage circuit 304 is set to a voltage that is higher than a voltage VSS of the ground terminal 105. If the input terminal 102 is open circuited, then the inverting input terminal of the comparator 303 is pulled down to the voltage VSS by the resistor 308. This enables the comparator 303 to detect that the input terminal 102 has been open circuited.

If an output signal of either one of the comparator 301 and the comparator 303 becomes a high signal, then the OR circuit 305 outputs a high signal. The constant current circuit 306 stops, so that the output terminal 103 of the operational amplifier 106 exhibits high impedance, making it possible to externally notify that the input terminal of the operational amplifier has been open circuited (refer to, for example, Patent Document 1).

[Patent Document 1] Japanese Patent Application Laid-Open No. 2003-143239

However, according to the conventional operational amplifier, there has been a problem in that an input terminal resistance cannot be increased in a normal operation mode, thus inconveniently restricting the voltage range of input signals that can be handled by the operational amplifier.

There has been another problem in that the output of the output terminal becomes inconstant when the input terminal is open circuited, resulting in an unstable operation of a circuit connected to the output terminal of the operational amplifier.

SUMMARY OF THE INVENTION

The present invention has been made to solve the problems described above and an object of the invention is to provide an operational amplifier that is capable of increasing an input terminal resistance in a normal operation mode and capable of detecting that an input terminal has been open circuited without restricting the voltage range of an input signal that can be handled by the operational amplifier.

To this end, an operational amplifier in accordance with the present invention has the following configuration.

The operational amplifier includes: a first comparator which has a non-inverting input terminal of the operational amplifier connected to a non-inverting input terminal thereof and which has an inverting input terminal of the operational amplifier connected to an inverting input terminal thereof having an input offset voltage; a second comparator which has an inverting input terminal of the operational amplifier connected to the non-inverting input terminal thereof and which has the non-inverting input terminal of the operational amplifier connected to an inverting input terminal thereof having an input offset voltage; an amplifier which has the non-inverting input terminal of the operational amplifier connected to a non-inverting input terminal thereof and which has the inverting input terminal of the operational amplifier connected to an inverting input terminal thereof; a logic circuit connected to an output terminal of the first comparator and an output terminal of the second comparator; a first resistor and a first switch which are provided between the non-inverting input terminal and a ground terminal of the operational amplifier and which are connected in series; and a second resistor and a second switch which are provided between the inverting input terminal and a supply terminal of the operational amplifier and which are connected in series.

According to the present invention, the comparators detect that the input terminal is open circuited, and the input terminal resistance can be increased in the normal operation mode by pulling down or pulling up the input terminal only when the input terminal is open circuited. This makes it possible to detect that the input terminal has been open circuited without restricting the voltage range of an input signal that can be handled by the operational amplifier.

DETAILED DESCRIPTION OF THE PREFERRED EMBODIMENTS

First Embodiment

Figure 1:
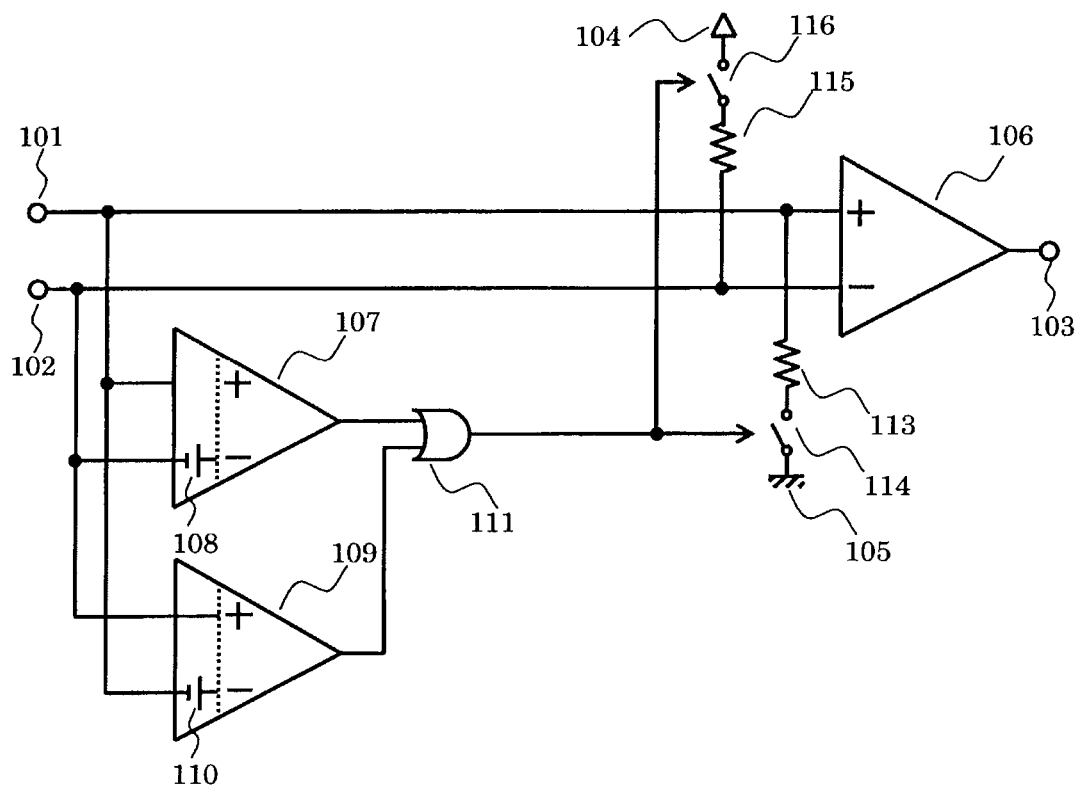
FIG. 1 is a circuit diagram of an operational amplifier according to a first embodiment of the present invention.

FIG. 1 is a circuit diagram of an operational amplifier according to a first embodiment. The operational amplifier according to the first embodiment is comprised of comparators 107, 109, an OR circuit 111, switches 114, 116, an operational amplifier 106, resistors 113, 115, input terminals 101, 102, an output terminal 103, a supply terminal 104, and a ground terminal 105.

The comparator 107 has a non-inverting input terminal thereof connected to the input terminal 101, a inverting input terminal thereof connected to the input terminal 102, and an output terminal thereof connected to a first input terminal of the OR circuit 111. The comparator 109 has an inverting input terminal thereof connected to the input terminal 101, the non-inverting input terminal thereof connected to the input terminal 102, and the output terminal thereof connected to the second input terminal of the OR circuit 111. An output of the OR circuit 111 is connected to the switch 116 and the switch 114 to control the ON/OFF thereof. The operational amplifier 106 has the non-inverting input terminal thereof connected to the input terminal 101, the inverting input terminal thereof connected to the input terminal 102, and the output thereof connected to the output terminal 103. The resistor 115 has one terminal thereof connected to the switch 116 and the other terminal thereof connected to the input terminal 102. The other terminal of the switch 116 is connected to the supply terminal 104. The resistor 113 has one terminal thereof connected to the switch 114 and the other terminal thereof connected to the input terminal 101. The other terminal of the switch 114 is connected to the ground terminal 105.

The operation of the operational amplifier according to the first embodiment will be described.

The comparator 107 has an offset 108 set at the inverting input terminal thereof Further, the comparator 109 has an offset 110 set at the inverting input terminal thereof. The voltage of the input terminal 101 will be denoted by V+, the voltage of the input terminal 102 will be denoted by V−, the voltage of the offset 108 will be denoted by VA, and the voltage of the offset 110 will be denoted by VB.

If (V+)>(V−)+(VA), then the comparator 107 outputs a high signal, while the comparator 109 outputs a low signal. This is expressed as follows.

$$(V+)-(V-)>(VA) \quad (1)$$

If the potential difference between the input terminal 101 and the input terminal 102 exceeds the voltage of the offset 108, then the comparator 107 outputs the high signal.

If (V−)>(V+)+(VB), then the comparator 109 outputs the high signal, while the comparator 107 outputs the low signal. This is expressed as follows.

$$(V+)-(V-)<-(VB) \quad (2)$$

If the potential difference between the input terminal 101 and the input terminal 102 becomes smaller than the voltage obtained by multiplying the voltage of the offset 110 by −, then the comparator 109 outputs the high signal.

Thus, the offset voltages VA and VB are set such that they are sufficiently large so as not to limit the voltage range of an input signal that can be handled by the operational amplifier and that the open circuiting of the input terminal can be detected.

The outputs of the comparator 107 and the comparator 109 are input to the OR circuit 111, and if either one of the comparator 107 and the comparator 109 outputs the high signal, then the OR circuit 111 outputs the high signal, thus turning the switches 116 and 114 on. Then, the input terminal 102 is pulled up to the voltage VDD of the supply terminal 104, while the input terminal 101 is pulled down to the voltage VSS of the ground terminal. Then, the output of the operational amplifier 106 is fixed to a low level.

The resistance values of the resistors 113 and 115 are set to be sufficiently large. Therefore, unless the input terminal 101 is open circuited, the input terminal 101 will not be pulled down to the voltage VSS even if the switch 114 is turned on. Similarly, even if the switch 116 is turned on, the input terminal 102 will not be pulled up to the voltage VDD.

When the input terminal 101 is open circuited, expression (2) is satisfied, so that the comparator 109 outputs the high signal. Upon receipt of the high signal output from the comparator 109, the OR circuit 111 outputs the high signal. Upon receipt of the high signal output from the OR circuit, the switch 114 is turned on, connecting the non-inverting input terminal of the operational amplifier 106 to the voltage VSS through the resistor 113. Upon receipt of the high signal output from the OR circuit 111, the switch 116 is turned on, connecting the inverting input terminal of the operational amplifier 106 to the voltage VDD through the resistor 115.

In this case, the input terminal 101 is open circuited, so that the non-inverting input terminal of the operational amplifier is pulled down to the voltage VSS. Hence, the operational amplifier 106 outputs the low signal to the output terminal 103. Thus, the operational amplifier according to the first embodiment detects that the input terminal 101 has been open circuited and externally notifies to that effect by fixing the output of the operational amplifier 106 to the low level.

When the input terminal 102 is open circuited, expression (1) is satisfied, so that the comparator 107 outputs the high signal. The OR circuit 111 outputs the high signal upon receipt of the high signal output from the comparator 107. The switches 116 and 114 turn on upon the receipt of the high signal.

In this case, the input terminal 102 is open circuited, so that the non-inverting input terminal of the operational amplifier 106 is pulled up to the voltage VDD. Hence, the operational amplifier 106 outputs the low signal to the output terminal 103. Thus, the operational amplifier according to the first embodiment detects that the input terminal 102 has been open circuited and externally notifies to that effect by fixing the output of the operational amplifier 106 to the low level.

In a normal operation state wherein a voltage signal is applied to the input terminal 101 and the input terminal 102, neither expression (1) nor (2) is satisfied, so that the comparators 107 and 109 output the low signal. The OR circuit 111 outputs the low signal, causing the switches 116 and 114 to turn off. Thus, the lowering of the input terminal resistance due to the resistors 115 and 113 can be prevented, making it possible to prevent the input signal voltage range from being restricted.

As described above, the operational amplifier according to the first embodiment allows the input terminal resistance to be increased during the normal operation state. This makes it possible to detect that an input terminal has been open circuited without restricting the voltage range of the input signals that can be handled by the operational amplifier.

Second Embodiment

Figure 2:
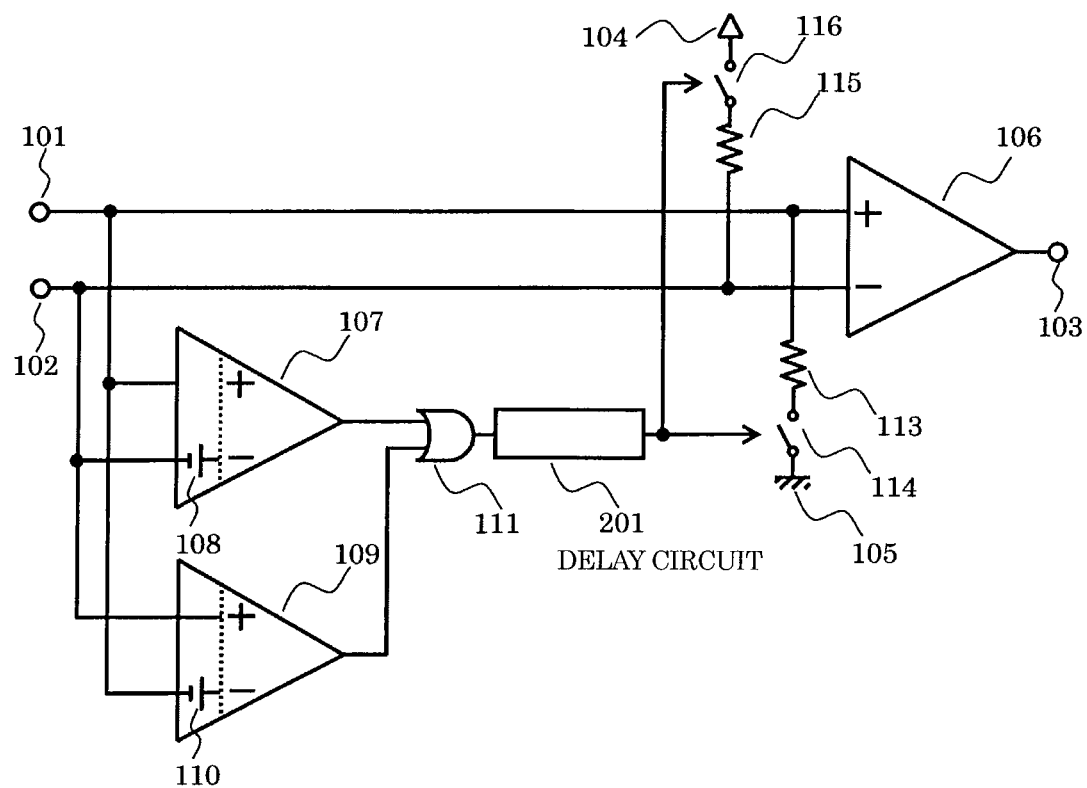
FIG. 2 is a circuit diagram of an operational amplifier according to a second embodiment of the present invention.
Figure 3:
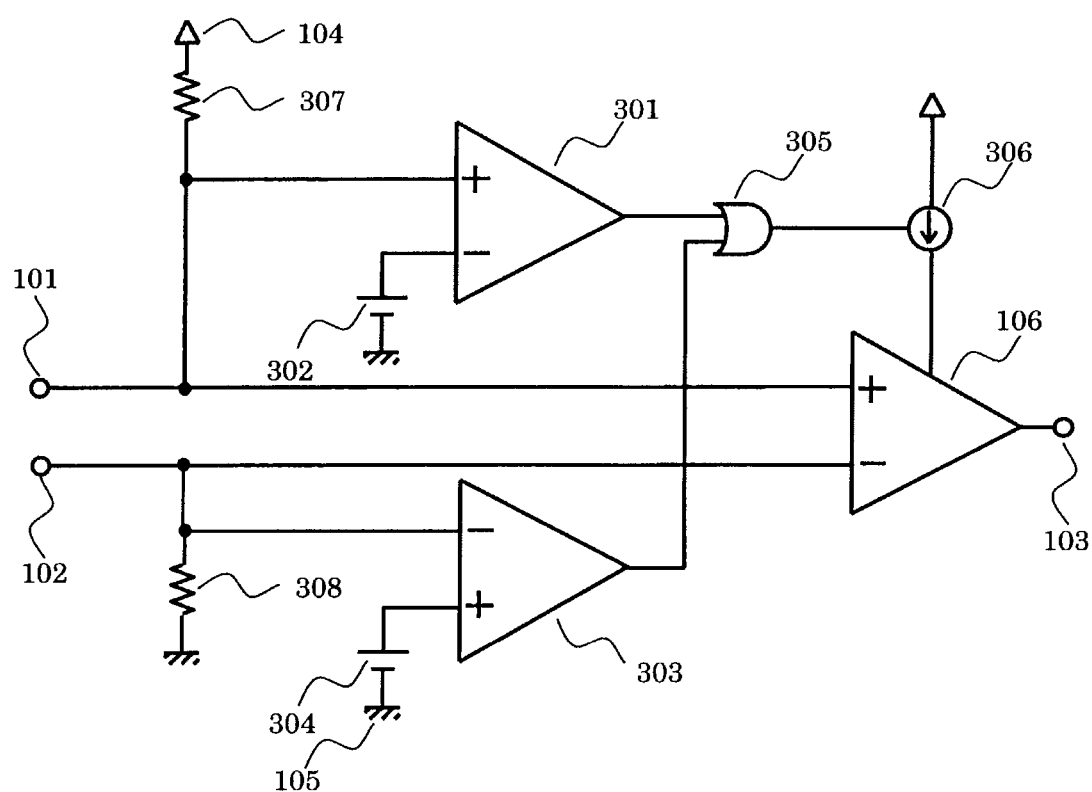
FIG. 3 is a circuit diagram of a conventional operational amplifier.

FIG. 2 is a circuit diagram of an operational amplifier according to a second embodiment. The difference from operational amplifier according to the first embodiment is the addition of a delay circuit 201. The delay circuit 201 is connected between an OR circuit 111 and switches 116 and 114. The rest of the circuit configuration is the same as that of the operational amplifier according to the first embodiment, so that the like reference numerals will be assigned and the description of the connections will be omitted.

The operation of the operational amplifier according to the second embodiment will be described.

A comparator 107 has an offset 108 set at an inverting input terminal. Further, a comparator 109 has an offset 110 set at an inverting input terminal. The voltage of an input terminal 101 will be denoted by V+, the voltage of an input terminal 102 will be denoted by V−, the voltage of the offset 108 will be denoted by VA, and the voltage of the offset 110 will be denoted by VB.

If (V+)>(V−)+(VA), then the comparator 107 outputs a high signal, while the comparator 109 outputs a low signal.

If (V−)>(V+)+(VB), then the comparator 109 outputs the high signal, while the comparator 107 outputs the low signal.

The outputs of the comparator 107 and the comparator 109 are input to an OR circuit 111, and if either of the comparators 107 and 109 outputs the high signal, then the OR circuit 111 outputs the high signal, causing the switches 116 and 114 to turn on through the delay circuit 201. Then, the input terminal 102 is pulled up to the voltage VDD of a supply terminal 104 and the input terminal 101 is pulled down to the ground terminal 105, fixing the output of the operational amplifier 106 to a low level.

In this case, the delay circuit 112 operates not to output the high signal from the OR circuit 111 to a circuit in a following stage for a certain period of time or less thereby to prevent a malfunction from taking place due to a transient voltage fluctuation of the input terminal 101 or 102.

As described above, the operational amplifier according to the second embodiment allows an input terminal resistance to be increased in a normal operation state, making it possible to detect that the input terminal has been open circuited without restricting the voltage range of input signals that can be handled by the operational amplifier. In addition, even if a transient voltage fluctuation takes place at an input terminal in the normal operation state, a malfunction of the circuit can be prevented.

What is claimed is:

1. An operational amplifier having an inverting input terminal, a non-inverting input terminal, and an output terminal, the operational amplifier comprising:
    a first comparator having a non-inverting input terminal of the operational amplifier connected to a non-inverting input terminal thereof and an inverting input terminal of the operational amplifier connected to an inverting input terminal thereof that has an input offset voltage;
    a second comparator having an inverting input terminal of the operational amplifier connected to a non-inverting input terminal thereof and a non-inverting input terminal of the operational amplifier connected to an inverting input terminal thereof that has an input offset voltage;
    an amplifier having the non-inverting input terminal of the operational amplifier connected to a non-inverting input terminal thereof and the inverting input terminal of the operational amplifier connected to an inverting input terminal thereof;
    a logic circuit connected to an output terminal of the first comparator and an output terminal of the second comparator;
    a first resistor and a first switch which are provided between the non-inverting input terminal and a ground terminal of the operational amplifier and which are connected in series; and
    a second resistor and a second switch which are provided between the inverting input terminal and a supply terminal of the operational amplifier and which are connected in series,
    wherein the first switch and the second switch are controlled by an output signal of the logic circuit.

2. The operational amplifier according to claim 1, wherein the output terminal of the logic circuit is provided with a delay circuit.

* * * * *